(12) United States Patent
Zhang et al.

(10) Patent No.: US 11,374,080 B2
(45) Date of Patent: Jun. 28, 2022

(54) FLEXIBLE DISPLAY SCREEN AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Jiaxiang Zhang, Beijing (CN); Kang Wang, Beijing (CN); Xiaoxia Liu, Beijing (CN); Junhui Yang, Beijing (CN); Fuzheng Xie, Beijing (CN); Haotian Yang, Beijing (CN); Bin Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 149 days.

(21) Appl. No.: 16/757,896

(22) PCT Filed: Apr. 19, 2019

(86) PCT No.: PCT/CN2019/083513
§ 371 (c)(1),
(2) Date: Apr. 21, 2020

(87) PCT Pub. No.: WO2020/211085
PCT Pub. Date: Oct. 22, 2020

(65) Prior Publication Data
US 2021/0233987 A1 Jul. 29, 2021

(51) Int. Cl.
*H01L 27/32* (2006.01)
*H01L 51/52* (2006.01)

(52) U.S. Cl.
CPC ...... *H01L 27/3272* (2013.01); *H01L 27/3276* (2013.01); *H01L 51/5246* (2013.01); *H01L 2251/5338* (2013.01)

(58) Field of Classification Search
CPC . H01L 51/50; H01L 51/5246; H01L 51/0097; H01L 51/56; H01L 51/0022;
(Continued)

(56) References Cited

U.S. PATENT DOCUMENTS

2007/0047323 A1\* 3/2007 Murooka ................ G11C 11/22
365/185.23
2011/0094651 A1 4/2011 Kuriki
(Continued)

FOREIGN PATENT DOCUMENTS

| CN | 104105386 A | 10/2014 |
| CN | 109427980 A | 3/2019 |

(Continued)

*Primary Examiner* — Vongsavanh Sengdara
(74) *Attorney, Agent, or Firm* — ArentFox Schiff LLP; Michael Fainberg

(57) ABSTRACT

The present invention discloses a flexible display screen and a display device. The flexible display screen includes: a flexible display panel, a first flexible electromagnetic shielding layer and a bottom film disposed in that order on a side, opposite to a light-emitting side, of the flexible display panel; the organic electroluminescent flexible display panel has a bending area, and the bending area is provided with signal lines; the flexible display screen further includes: a second flexible electromagnetic shielding layer disposed on a light-emitting side of the flexible display panel and covering the signal lines, and a colloidal insulating layer covering the second flexible electromagnetic shielding layer; and the materials of the first flexible electromagnetic shielding layer and the second flexible electromagnetic shielding layer are both conductive materials with fluidity.

19 Claims, 3 Drawing Sheets

(58) Field of Classification Search
CPC ............. H01L 51/5253; H01L 27/3276; H01L 27/3272; H01L 2251/5338
See application file for complete search history.

(56) References Cited

U.S. PATENT DOCUMENTS

| | | |
|---|---|---|
| 2013/0045374 A1 | 2/2013 | Yu et al. |
| 2017/0271616 A1* | 9/2017 | Choi .................... H01L 51/0097 |
| 2018/0182829 A1* | 6/2018 | Shin ..................... H01L 51/5256 |
| 2019/0140202 A1* | 5/2019 | Jin ...................... H01L 27/3276 |
| 2020/0013987 A1* | 1/2020 | Lee ..................... H01L 51/5246 |
| 2020/0028123 A1* | 1/2020 | Xie ..................... B32B 38/0004 |
| 2020/0177181 A1* | 6/2020 | Nishimura ........... H03K 17/962 |
| 2020/0194698 A1* | 6/2020 | Zhai ..................... H01L 23/562 |
| 2020/0209925 A1* | 7/2020 | Paek ........................ G09F 9/301 |
| 2020/0280005 A1* | 9/2020 | Fang ......................... G09F 9/30 |
| 2020/0381672 A1* | 12/2020 | Tanaka ..................... G09F 9/30 |
| 2021/0036084 A1* | 2/2021 | Sun ..................... G06F 3/04182 |
| 2021/0183840 A1* | 6/2021 | Wang ...................... H01L 51/56 |
| 2021/0210579 A1* | 7/2021 | Huang ................ H01L 27/3276 |

FOREIGN PATENT DOCUMENTS

| | | |
|---|---|---|
| CN | 109524434 A | 3/2019 |
| CN | 109575827 A | 4/2019 |

\* cited by examiner

FLEXIBLE DISPLAY SCREEN AND DISPLAY DEVICE

The present application is a US National Stage of International Application No. PCT/CN2019/083513, filed on Apr. 19, 2019, and entitled "FLEXIBLE DISPLAY SCREEN AND DISPLAY DEVICE", the content of which is incorporated by reference herein in its entirety.

FIELD

The present invention relates to the technical field of display, in particular to a flexible display screen and a display device.

BACKGROUND

With the advent of 5G network, electromagnetic shielding of a bending area for the active-matrix organic light-emitting diode (AMOLED) display module is strongly required. The AMOLED is small in thickness, fragile and easily damaged, so after a conductive fabric is attached to an outer surface of the AMOLED, the conductive fabric tends to exert a pulling force on the AMOLED in a bending process, thereby easily causing damage to the AMOLED, and leading to poor display. Moreover, since the AMOLED has a small bending angle, it is impractical to attach a conductive fabric on an inner surface of the AMOLED. Therefore, the existing electromagnetic shielding methods are not applicable to electromagnetic shielding of a bending area of the AMOLED.

SUMMARY

In view of this, an embodiment of the present invention provides a flexible display screen and a display device, with the specific solution as follows.

The embodiment of the present invention provides a flexible display screen, including:

a flexible display panel, a first flexible electromagnetic shielding layer and a bottom film disposed in that order on a side, opposite to a light-emitting side, of the flexible display panel; where the flexible display panel has a bending area, and the bending area is provided with signal lines;

the flexible display screen further includes: a second flexible electromagnetic shielding layer disposed on the light-emitting side of the flexible display panel and covering the signal line, and a colloidal insulating layer covering the second flexible electromagnetic shielding layer; and the materials of the first flexible electromagnetic shielding layer and the second flexible electromagnetic shielding layer are both conductive materials with fluidity.

Optionally, in the flexible display screen provided in the embodiment of the present invention, the material of the first flexible electromagnetic shielding layer is conductive adhesive, and the bottom film is affixed to the side, opposite to the light-emitting side, of the flexible display panel through the conductive adhesive.

Optionally, in the flexible display screen provided in the embodiment of the present invention, the material of the second flexible electromagnetic shielding layer is conductive adhesive.

Optionally, in the flexible display screen provided in the embodiment of the present invention, the conductive adhesive is pressure-sensitive conductive adhesive.

Optionally, in the flexible display screen provided in the embodiment of the present invention, the thickness of the bottom film in the bending area is smaller than the thickness of the bottom film in other areas other than the bending area.

Optionally, in the flexible display screen provided in the embodiment of the present invention, the material of the bottom film is a poly(terephthalic acid) plastic.

Optionally, in the flexible display screen provided in the embodiment of the present invention, the thickness of the colloid insulating layer is so set that the signal line of the bending area is in an extruded state.

Optionally, in the flexible display screen provided in the embodiment of the present invention, the thickness of the colloid insulating layer is 13 µm-15 µm.

Optionally, in the flexible display screen provided in the embodiment of the present invention, the flexible display panel is an organic electroluminescent flexible display panel.

Based on the same inventive concept, the embodiment of the present invention further provides a display device, including the above flexible display screen provided in the embodiment of the present invention.

As to the above flexible display screen and the display device provided in the embodiment of the present invention, the flexible display screen includes: a flexible display panel, a first flexible electromagnetic shielding layer and a bottom film disposed in that order on a side, opposite to a light-emitting side, of the flexible display panel; the organic electroluminescent flexible display panel has a bending area, and the bending area is provided with signal lines; the flexible display screen further includes: a second flexible electromagnetic shielding layer disposed on the light-emitting side of the flexible display panel and covering the signal line, and a colloidal insulating layer covering the second flexible electromagnetic shielding layer; and the materials of the first flexible electromagnetic shielding layer and the second flexible electromagnetic shielding layer are both conductive materials with fluidity. Due to the fluidity of the first flexible electromagnetic shielding layer and the second flexible electromagnetic shielding layer, the stress of the display screen in the bending process can be absorbed favorably, thereby effectively protecting the bending area of the flexible display panel, and preventing cracking and disconnection of the flexible display panel in the bending area. Moreover, the first flexible electromagnetic shielding layer and the second flexible electromagnetic shielding layer can electromagnetically shield the signal line of the bending area.

DETAILED DESCRIPTION OF THE EMBODIMENTS

Figure 1:
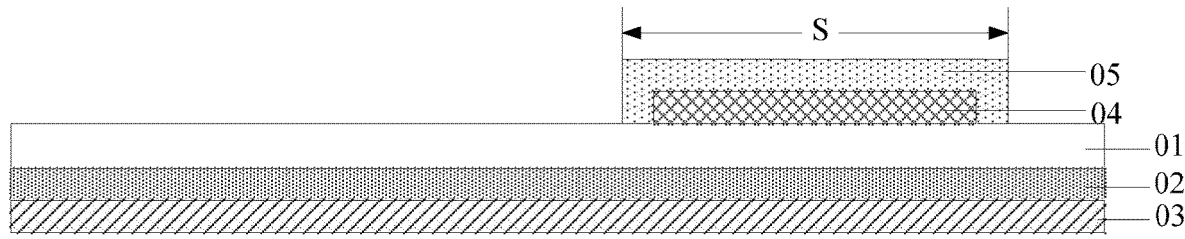
FIG. 1 is the first structural schematic diagram of a flexible display screen provided in an embodiment of the present invention.

In order to make the objects, technical solutions, and advantages of the present invention more apparent, the present invention will be described below in further details with reference to the drawings, and apparently the embodiments described below are only a part but not all of the embodiments of the present invention. Based upon the embodiments here of the present invention, all the other embodiments which can occur to those skilled in the art without any inventive effort shall fall into the protection scope of the present invention.

The shape and size of each part in the drawings do not reflect true proportions, merely aiming at schematically illustrating the content of the present invention.

As shown in FIG. 1, a flexible display screen provided in an embodiment of the present invention includes:

a flexible display panel 01; and a first flexible electromagnetic shielding layer 02 and a bottom film 03 disposed in sequence on a side, opposite to a light-emitting side, of the flexible display panel 01; where the flexible display panel 01 has a bending area S, and the bending area S is provided with signal lines (not shown in the figure);

the flexible display screen further includes: a second flexible electromagnetic shielding layer 04 disposed on the light-emitting side of the flexible display panel 01 and covering the signal lines, and a colloidal insulating layer 05 covering the second flexible electromagnetic shielding layer 04.

Here the materials of the first flexible electromagnetic shielding layer 02 and the second flexible electromagnetic shielding layer 04 are both conductive materials with fluidity.

As to the above flexible display screen, and the display device provided in the embodiment of the present invention, the flexible display screen includes: a flexible display panel, a first flexible electromagnetic shielding layer and a bottom film disposed in sequence on a side, opposite to a light-emitting side, of the flexible display panel; the organic electroluminescent flexible display panel has a bending area, and the bending area is provided with signal lines; the flexible display screen further includes: a second flexible electromagnetic shielding layer disposed on the light-emitting side of the flexible display panel and covering the signal lines, and a colloidal insulating layer covering the second flexible electromagnetic shielding layer; and the materials of the first flexible electromagnetic shielding layer and the second flexible electromagnetic shielding layer are both conductive materials with fluidity. Due to the fluidity of the first flexible electromagnetic shielding layer and the second flexible electromagnetic shielding layer, the stress of the display screen in the bending process can be absorbed favorably, thereby effectively protecting the bending area of the flexible display panel, and preventing cracking and disconnection of the flexible display panel in the bending area. Moreover, the first flexible electromagnetic shielding layer and the second flexible electromagnetic shielding layer can electromagnetically shield the signal lines in the bending area.

Optionally, in the flexible display screen provided in the embodiment of the present invention, the second flexible electromagnetic shielding layer covers the bending area, that is, the orthographic projection of the second flexible electromagnetic shielding layer on the flexible display panel overlaps the bending area.

Optionally, in the flexible display screen provided in the embodiment of the present invention, the material of the first flexible electromagnetic shielding layer is conductive adhesive, and the bottom film is affixed to the side, opposite to the light-emitting side, of the flexible display panel through the conductive adhesive. In this way, the conductive adhesive can shield electromagnetic signals due to the conductive properties. Moreover, the conductive adhesive can also serve as a binding agent for the bottom film and the flexible display panel, so as to reduce the thickness of the flexible display screen.

Optionally, in the flexible display screen provided in the embodiment of the present invention, the material of the second flexible electromagnetic shielding layer is conductive adhesive. In this way, the conductive adhesive can shield electromagnetic signals due to the conductive properties.

Optionally, in the flexible display screen provided in the embodiment of the present invention, the conductive adhesive is pressure-sensitive conductive adhesive. Due to the pressure-sensitive property and fluidity of the pressure-sensitive conductive adhesive, the stress of the flexible display screen in the bending process can be absorbed favorably, thereby effectively protecting the bending area of the flexible display screen, and preventing cracking and disconnection of the flexible display screen.

Figure 2:
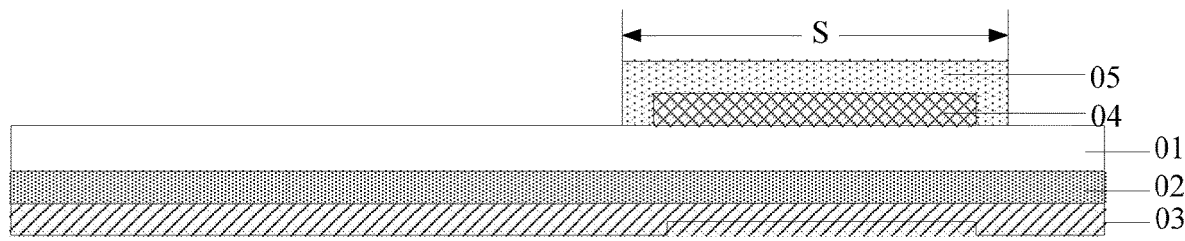
FIG. 2 is the second structural schematic diagram of a flexible display screen provided in an embodiment of the present invention.
Figure 3:
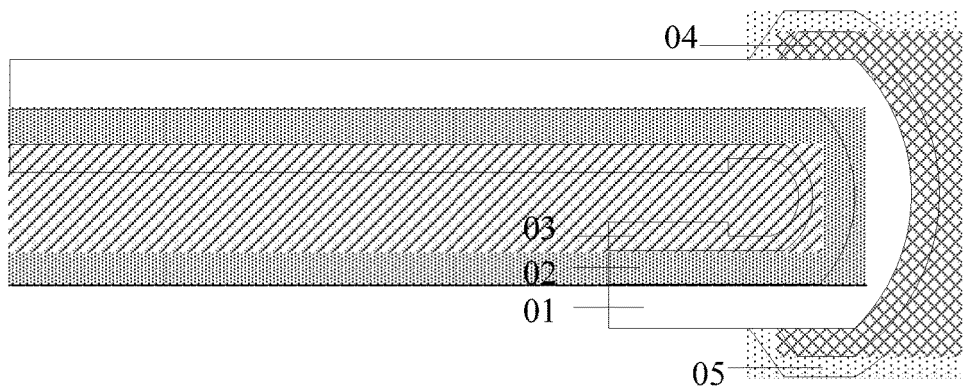
FIG. 3 is the third structural schematic diagram of a flexible display screen provided in an embodiment of the present invention.

Optionally, in the flexible display screen provided in the embodiment of the present invention, as shown in FIG. 2 and FIG. 3, the thickness of the bottom film 03 in the bending area S is smaller than the thickness of the bottom film 03 in other areas other than the bending area S, thereby being beneficial for bending of the flexible display screen in the bending area.

Optionally, in the flexible display screen provided in the embodiment of the present invention, the material of the bottom film is a poly(terephthalic acid) plastic. Such material not only can support the flexible display panel, but also can serve as the insulating layer and protecting layer of the first flexible electromagnetic shielding layer.

Optionally, in the flexible display screen provided in the embodiment of the present invention, the thickness of the colloid insulating layer is so set that the signal lines in the bending area are in an extruded state. The colloid insulating layer not only can insulate and protect the second flexible electromagnetic shielding layer, but also can avoid disconnection of the signal lines caused by a tensile stress by making the signal lines in the bending area be in an extruded state.

Optionally, in the flexible display screen provided in the embodiment of the present invention, the thickness of the colloid insulating layer is set between 13 μm and 15 μm, such that the signal lines in the bending area is in an extruded state, and the specific thickness can be set according to the actual thickness of the flexible display screen, and is not defined herein.

During specific implementation, in the flexible display screen provided in the embodiment of the present invention, the colloid insulating layer is a micro coating layer (MCL), and the material is generally photosensitive adhesive, which is not defined herein.

Optionally, in the flexible display screen provided in the embodiment of the present invention, the flexible display panel is an organic electroluminescent flexible display panel. Of course, during specific implementation, the flexible display panel can also be a flexible liquid crystal display panel, electronic paper, etc., and is not defined herein.

Figure 4:
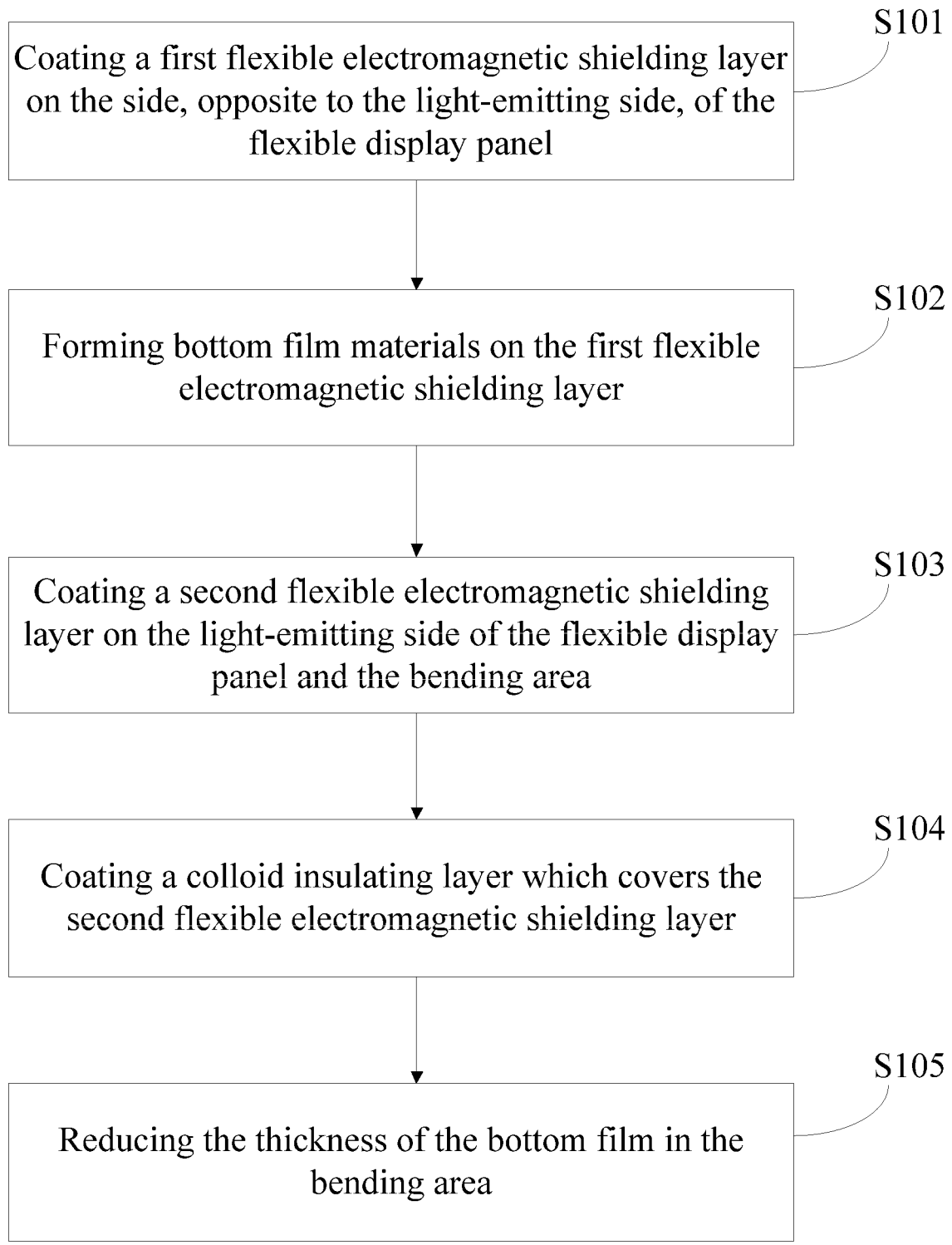
FIG. 4 is a flow chart of a preparation method of a flexible display screen provided in an embodiment of the present invention.

Specifically, as shown in FIG. 4, the preparation method of the flexible display screen provided in an embodiment of the present invention can include the following steps.

Figure 5A:
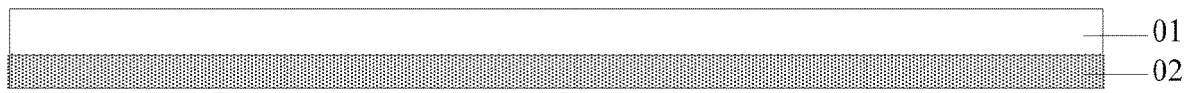
FIG. 5a to FIG. 5c are respectively schematic diagrams of structures after respective steps of the preparation method provided in an embodiment of the present invention is performed.

S101, coating a first flexible electromagnetic shielding layer 02 on the side, opposite to a light-emitting side, of the flexible display panel 01, as shown in FIG. 5a.

Here the material of the first flexible electromagnetic shielding layer is pressure-sensitive conductive adhesive.

Figure 5B:
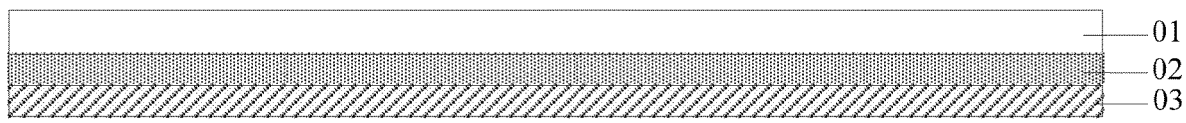

S102, forming bottom film 03 materials on the first flexible electromagnetic shielding layer 02, as shown in FIG. 5b.

Figure 5C:
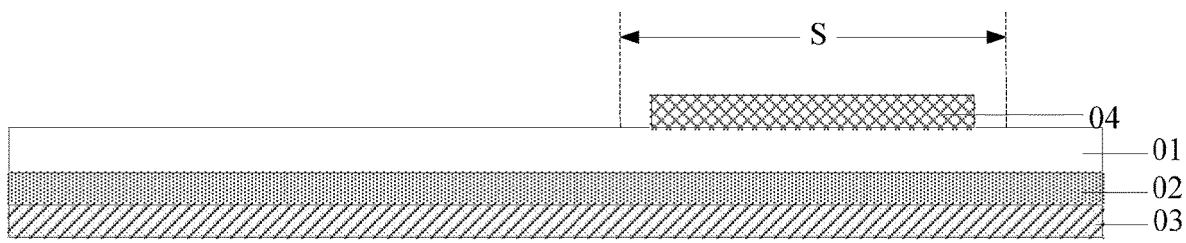

S103, coating a second flexible electromagnetic shielding layer 04 on the light-emitting side of the flexible display panel 01 in the bending area S, as shown in FIG. 5c.

Here the material of the second flexible electromagnetic shielding layer is pressure-sensitive conductive adhesive.

S104, coating a colloid insulating layer 05 which covers the second flexible electromagnetic shielding layer 04, as shown in FIG. 1.

S105, reducing the thickness of the bottom film 03 in the bending area S, as shown in FIG. 2 and FIG. 3.

During specific implementation, it is practical as long as step S102 follows step S101, step S104 follows step S103, and step S105 follows step S104, which is not defined herein.

Based on the same inventive concept, the embodiment of the present invention further provides a display device, including any of the above flexible display screens provided in the embodiment of the present invention. The display device can be a mobile phone, a tablet computer, a television, a display, a notebook computer, a digital photo frame, a navigator and any other products or parts with a display function. The other essential components of the display device should be provided as understood by those skilled in the art, are not repeated redundantly herein, and also should not be deemed as a limitation to the present invention. For the implementation of the display device, please refer to the above embodiment of the liquid crystal display panel, and repeated parts will not be repeated redundantly herein.

As to the above flexible display screen and the display device provided in the embodiment of the present invention, the flexible display screen includes: a flexible display panel, a first flexible electromagnetic shielding layer and a bottom film disposed in sequence on a side, opposite to a light-emitting side, of the flexible display panel; the organic electroluminescent flexible display panel has a bending area, and the bending area is provided with signal lines; the flexible display screen further includes: a second flexible electromagnetic shielding layer disposed on the light-emitting side of the flexible display panel and covering the signal line, and a colloidal insulating layer covering the second flexible electromagnetic shielding layer; and the materials of the first flexible electromagnetic shielding layer and the second flexible electromagnetic shielding layer are both conductive materials with fluidity. Due to the fluidity of the first flexible electromagnetic shielding layer and the second flexible electromagnetic shielding layer, the stress of the display screen in the bending process can be absorbed favorably, thereby effectively protecting the bending area of the flexible display panel, and preventing cracking and disconnection of the flexible display panel in the bending area. Moreover, the first flexible electromagnetic shielding layer and the second flexible electromagnetic shielding layer can electromagnetically shield the signal lines in the bending area.

Evidently those skilled in the art can make various modifications and variations to the embodiment of the present invention without departing from the spirit and scope of the embodiment of the present invention. Thus the present invention is also intended to encompass these modifications and variations thereto so long as the modifications and variations come into the scope of the claims appended to the present invention and their equivalents.

The invention claimed is:

1. A flexible display screen, comprising:
   a flexible display panel;
   a first flexible electromagnetic shielding layer and a bottom film disposed in that order on a side, opposite to a light-emitting side, of the flexible display panel; wherein the flexible display panel has a bending area, and the bending area is provided with signal lines; and the flexible display screen further comprises:
   a second flexible electromagnetic shielding layer disposed on the light-emitting side of the flexible display panel, wherein the second flexible electromagnetic shielding layer covers the signal lines, and
   a colloidal insulating layer covering the second flexible electromagnetic shielding layer;
   wherein materials of the first flexible electromagnetic shielding layer and the second flexible electromagnetic shielding layer are both conductive materials; material of the first flexible electromagnetic shielding layer is conductive adhesive, and material of the second flexible electromagnetic shielding layer is conductive adhesive.

2. The flexible display screen of claim 1, wherein the bottom film is affixed to the side, opposite to the light-emitting side, of the flexible display panel through the conductive adhesive.

3. The flexible display screen of claim 2, wherein the conductive adhesive is pressure-sensitive conductive adhesive.

4. The flexible display screen of claim 2, wherein a thickness of the bottom film in the bending area is smaller than a thickness of the bottom film in other areas other than the bending area.

5. The flexible display screen of claim 2, wherein material of the bottom film is a poly (terephthalic acid) plastic.

6. The flexible display screen of claim 2, wherein a thickness of the colloid insulating layer is so set that the signal lines in the bending area is in an extruded state.

7. The flexible display screen of claim 2, wherein a thickness of the colloid insulating layer is 13 μm-15 μm.

8. The flexible display screen of claim 2, wherein the flexible display panel is an organic electroluminescent flexible display panel.

9. The flexible display screen of claim 1, wherein a thickness of the bottom film in the bending area is smaller than a thickness of the bottom film in other areas other than the bending area.

10. The flexible display screen of claim 1, wherein material of the bottom film is a poly(terephthalic acid) plastic.

11. The flexible display screen of claim 1, wherein a thickness of the colloid insulating layer is so set that the signal lines in the bending area is in an extruded state.

12. The flexible display screen of claim 1, wherein a thickness of the colloid insulating layer is 13 μm-15 μm.

13. The flexible display screen of claim 1, wherein the flexible display panel is an organic electroluminescent flexible display panel.

14. A display device, comprising the flexible display screen of claim 1.

15. The flexible display screen of claim 1, wherein the conductive adhesive is pressure-sensitive conductive adhesive.

16. The flexible display screen of claim 1, wherein a thickness of the bottom film in the bending area is smaller than a thickness of the bottom film in other areas other than the bending area.

17. The flexible display screen of claim 1, wherein material of the bottom film is a poly(terephthalic acid) plastic.

18. The flexible display screen of claim 1, wherein a thickness of the colloid insulating layer is so set that the signal lines in the bending area is in an extruded state.

19. The flexible display screen of claim 1, wherein a thickness of the colloid insulating layer is 13 μm-15 μm.

* * * * *